(12) United States Patent
Joly et al.

(10) Patent No.: US 7,763,915 B2
(45) Date of Patent: Jul. 27, 2010

(54) THREE-DIMENSIONAL INTEGRATED C-MOS CIRCUIT AND METHOD FOR PRODUCING SAME

(75) Inventors: Jean-Pierre Joly, Saint Egrève (FR); Olivier Faynot, Seyssinet-Pariset (FR); Laurent Clavelier, Voiron (FR)

(73) Assignee: Commissariat a l'Energie Atomique, Paris (FR)

( * ) Notice: Subject to any disclaimer, the term of this patent is extended or adjusted under 35 U.S.C. 154(b) by 506 days.

(21) Appl. No.: 11/654,660

(22) Filed: Jan. 18, 2007

(65) Prior Publication Data

US 2007/0170471 A1 Jul. 26, 2007

(30) Foreign Application Priority Data

Jan. 23, 2006 (FR) .................................. 06 00577

(51) Int. Cl.
*H01L 29/80* (2006.01)
(52) U.S. Cl. .................. 257/278; 257/350; 257/351; 257/357; 257/369; 257/370; 257/627; 257/628; 257/E21.614; 257/E27.026
(58) Field of Classification Search ................ 257/278, 257/350, 351, 357, 369, 370, 627, 628, E21.614, 257/E27.026
See application file for complete search history.

(56) References Cited

U.S. PATENT DOCUMENTS 6,902,962 B2 * 6/2005 Yeo et al. .................... 438/150
7,208,815 B2 * 4/2007 Chen et al. .................. 257/627
7,298,009 B2 * 11/2007 Yan et al. .................... 257/357
7,432,149 B2 * 10/2008 Wu et al. ..................... 438/222
7,524,707 B2 * 4/2009 Adetutu et al. .............. 438/150
2004/0065884 A1 4/2004 Bhattacharyya
2004/0065927 A1 4/2004 Bhattacharyya
2004/0145399 A1 7/2004 Bhattacharyya
2004/0178826 A1 9/2004 Bhattacharyya
2005/0285159 A1 * 12/2005 Chan et al. .................. 257/288
2007/0145367 A1 * 6/2007 Chen et al. ..................... 257/49

OTHER PUBLICATIONS

M. Yang et al., "High Performance CMOS Fabricated on Hybrid Substrate With Different Crystal Orientations," IEEE, IEDM 03, pp. 453-456, 2003.
Kaustav Banerjee et al., "3-D ICs: A Novel Chip Design for Improving Deep-Submicrometer Interconnect Performance and Systems-on-Chip Integration," Proceeding of the IEEE, vol. 89, No. 5, pp. 602-633, May 2001.
D.S. Yu et al., "Three-Dimensional Metal Gate-High-K-GOI CMOSFETs on 1-Poly-6-Metal 0.18-μm Si Devices," IEEE Electron Device Letters, vol. 26, No. 2, pp. 118-120, Feb. 2005.

* cited by examiner

*Primary Examiner*—Andy Huynh
(74) *Attorney, Agent, or Firm*—Oliff & Berridge, PLC

(57) ABSTRACT

The three-dimensional integrated CMOS circuit is formed in a hybrid substrate. n-MOS type transistors are formed, at a bottom level, in a first semi-conducting layer of silicon having a (100) orientation, which layer may be tension strained. p-MOS transistors are formed, at a top level, in a preferably monocrystalline and compression strained second semi-conducting layer of germanium having a (110) orientation. The second semi-conducting layer is transferred onto a first block in which the n-MOS transistors were previously formed, and the p-MOS transistors are then formed.

18 Claims, 4 Drawing Sheets

THREE-DIMENSIONAL INTEGRATED C-MOS CIRCUIT AND METHOD FOR PRODUCING SAME

BACKGROUND OF THE INVENTION

The invention relates to a three-dimensional integrated CMOS circuit formed in a hybrid substrate and comprising transistors of different conductivity types, respectively formed in first and second semi-conducting layers located at two respectively bottom and top superposed levels.

The invention also relates to a method for manufacturing such a circuit.

STATE OF THE ART

Seeking to achieve rapidity in C-MOS integrated circuits implies a reduction of the transistor switching times and of the propagation delays in the circuit interconnections.

Reduced switching times can be achieved by reducing the transistor channel length and by increasing the carrier mobility in the semi-conductor. The carrier mobility can be increased by using two semi-conducting layers each having an improved mobility, respectively for electrons and for holes, instead of the standard, (100)-oriented, unstrained bulk silicon conventionally used for both n-MOS and p-MOS transistors of the circuit. An increased mobility for electrons in n-MOS transistors and for holes in p-MOS transistors can be obtained by a choice of crystalline orientation, straining the semi-conductors, changing material or a combination of several of these parameters. Thus, a tension strain in silicon improves the electron mobility, a (110) surface orientation achieves a better holes mobility but a less good electron mobility than the (100) orientation, germanium gives a better holes mobility than silicon, etc. Moreover, the gate dielectrics and the gate electrode materials are preferably chosen to suit both types of transistors, especially if the latter are achieved in two layers of different nature, strain or orientation.

It is thus known to use a hybrid substrate for fabrication of a C-MOS circuit, i.e. a substrate on which two types of semi-conducting layers are formed.

At present there are essentially three methods for fabricating a hybrid substrate.

A first method, illustrated in FIGS. 1 to 3, uses heteroepitaxy. Epitaxial layers 1 and 2, respectively designed to act as base for the n-MOS and p-MOS transistors, are successively formed on a substrate 3. Typically, a first buffer layer of SiGe alloy is grown by CVD on a silicon substrate 3 with a (100) orientation, the composition thereof gradually increasing until a relaxed pure germanium layer is obtained at the surface. A thin layer 2 of strained silicon is grown on this layer 1. After selective local elimination of the strained silicon layer 2, the p-MOS transistors 4 are formed in the germanium layer 1 and the n-MOS transistors 5 are formed in the strained silicon layer 2. Interconnections 6 between the p-MOS and n-MOS transistors are then formed, for example as represented schematically in FIG. 3, between the drain and source of the p-MOS and n-MOS transistors.

A second method, in particular described in the article "High Performance CMOS Fabricated on Hybrid Substrate With Different Crystal Orientations", by Yang et al., in IEDM 03-453, p. 18.7.1-18.7.2, and illustrated schematically in FIG. 4, uses layer transfer by molecular bonding. A silicon substrate 7 with a given orientation, for example (110), is oxidized (insulating layer 8) and then transferred by the Smart Cut® technology (hydrogen implantation, bonding and detachment at the location of the broken line 9) on a silicon substrate 3 with a different orientation, for example (100). The thinned top layer (substrate 7 on insulator 8) thus forms a silicon on insulator (SOI) layer in which the p-MOS transistors are subsequently formed. This layer is etched to expose the surface of the substrate 3 at the locations scheduled for the n-MOS transistors. Silicon with a (100) orientation is then grown selectively, by localized homo-epitaxy in the holes thus formed, in which the n-MOS transistors will subsequently be formed. In the above-mentioned article, the n-MOS and p-MOS transistors are thus formed at the same level, in silicon substrates with different orientations.

A third method, not represented, uses localized elastic deformations. The n-MOS and p-MOS transistors are then made from the same material (for example Si), in adjacent zones, respectively formed by layers with a strong tension strain and with a strong compression strain.

At present, decreasing the propagation delay in the interconnections is essentially achieved by reducing the resistivity of the metals (use of copper) and/or the permittivity of the dielectrics used in the interconnections. Reducing the permittivity of the dielectrics means increasing their porosity, resulting in their mechanical and thermal properties being considerably impaired. It is therefore difficult to go any further in this direction.

A reduction of the propagation delay in the interconnections has also been obtained by three-dimensional integration (3D integration) of the circuits, the transistors being stacked on one another.

US Patent application 2004/0145399 describes a three-dimensional CMOS circuit formed by superposition of a p-MOS transistor on an n-MOS transistor (or vice-versa). The top semi-conducting layer is formed by localized epitaxy using as seed a semi-conducting via, itself formed by epitaxial growth of the bottom semi-conductor. The source and drain of the n-MOS transistor are aligned vertically respectively with the source and drain of the p-MOS transistor. The same is the case for their gates. Interconnections are provided, in particular to connect the two transistors in the manner represented in FIG. 5, to form an inverter. The two transistors are thus connected in series between a supply terminal and ground, the point common to the two transistors in series constituting the output O of the inverter, and their gates are connected to the input I of the inverter.

In the embodiment described in the article "3-D ICs: A Novel Chip Design for Improving Deep-Submicrometer Interconnect Performance and Systems-on-Chip Integration", by Banerjee et al., in Proceedings of the IEEE, vol. 89, no. 5, p. 602-630, May 2001, transistors or complete circuit blocks including their metallizations and a part of the interconnections are achieved separately on at least two substrates. The blocks are then aligned and stuck one above the other. One of the substrates is eliminated and the different levels are interconnected by known surface metallization techniques. The connection density from one level to the other is in particular limited by the alignment technologies available at present (at best about 1 to 2 µm).

The article "Three-Dimensional Metal Gate-High-K-GOI CMOSFETS on 1-Poly-6-Metal 0.18 µm Si Devices", by Yu et al., in IEEE Electron Device Letters, vol. 26, no. 2, p. 118-120, February 2005, describes 3D integration of CMOS formed in a germanium on insulator (GeOI) layer and of CMOS formed in silicon. Superposition is achieved by transfer by the Smart Cut® technology (hydrogen implantation, bonding and detachment) of a germanium layer above copper interconnect multilayers of the CMOS circuits produced beforehand in the silicon, at the first level. CMOS circuits are then formed in the germanium, at the second level, without affecting the underlying structures.

OBJECT OF THE INVENTION

The object of the invention is to provide a three-dimensional circuit that does not present the shortcomings of known circuits, as well as to provide a method for producing same. More particularly, the object of the invention is to optimize fabrication of one such circuit.

According to the invention, this object is achieved by a circuit according to the appended claims, more particularly by the fact that the n-MOS transistors are formed, at the bottom level, in the first semi-conducting layer, which is made of silicon with a (100) orientation, the p-MOS transistors being formed, at the top level, in the second semi-conducting layer, which is made of germanium with a (110) orientation.

A method for producing one such circuit successively comprises:
 fabrication of a first block comprising the n-MOS transistors formed in a semi-conducting layer of silicon having a suitable orientation for fabrication of n-MOS transistors,
 transfer onto the first block of a semi-conducting layer of germanium having a suitable orientation for fabrication of p-MOS transistors and
 fabrication of the p-MOS transistors in the germanium semi-conducting layer at a temperature not affecting the transistors formed in the silicon semi-conducting layer.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 6:
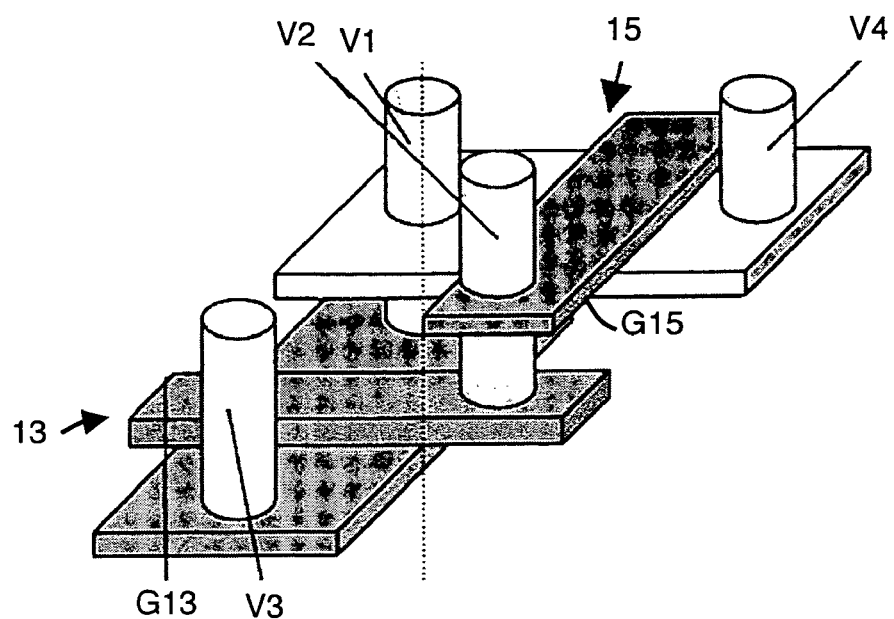
FIGS. 6 to 8 illustrate a particular embodiment of a circuit according to the invention respectively in perspective, in top view and in cross-section along A-A.
Figure 7:
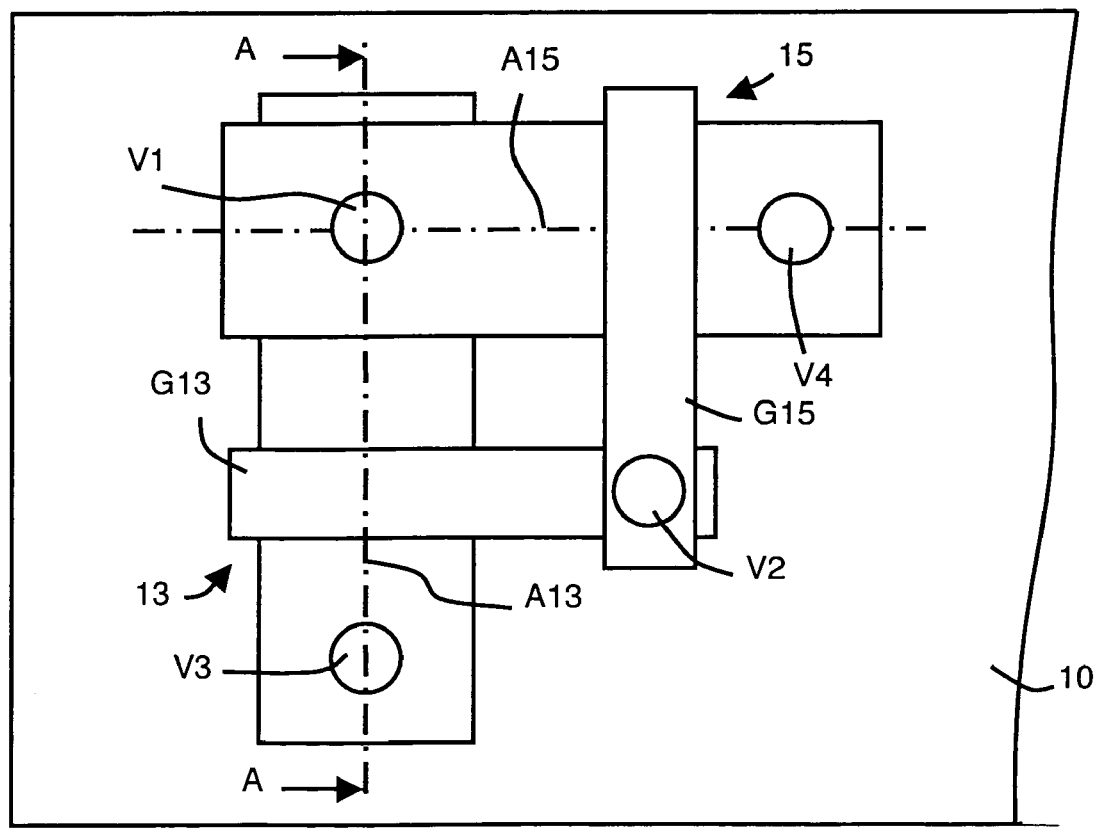
Figure 8:
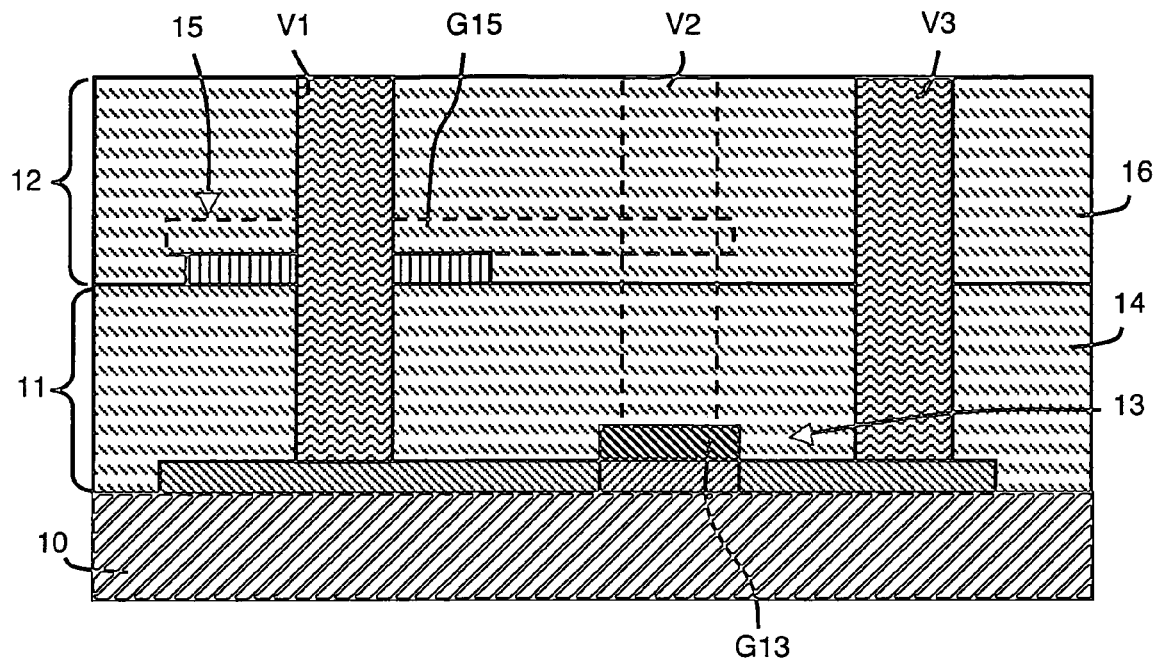

The three-dimensional circuit represented in FIGS. 6 to 8 comprises, on a substrate 10 (not represented in the perspective view of FIG. 6), two superposed levels, respectively the bottom level 11 and the top level 12 (FIG. 8).

The bottom level 11 comprises the n-MOS transistors 13 formed in a first semi-conducting layer. This layer is made of silicon having a suitable orientation for fabrication of n-MOS transistors. The bottom level is completed by a bottom dielectric layer 14 (not represented in the perspective view of FIG. 6), deposited on the transistors 13 and the substrate 10. The free surface of the bottom dielectric layer is then planarized.

The top level 12 is arranged on the flat free surface of the bottom dielectric layer 14. It comprises the p-MOS transistors 15 formed in a second semi-conducting layer and covered by a top dielectric layer 16 (not represented in the perspective view of FIG. 6). The second semi-conducting layer is made of germanium having a different orientation, suitable for fabrication of p-MOS transistors. The germanium layer is preferably made of pure germanium, but it can possibly be made of very concentrated germanium, for example of SiGe with more than 80%, preferably more than 90%, of germanium. The physical properties, in particular the band gap, of such an alloy are comparable with that of pure germanium.

Producing the p-MOS transistors in the germanium layer can be performed at a temperature of about 400 to 600° C., not affecting the n-MOS transistors 13 formed in the silicon at the bottom level, more particularly during the production steps requiring a high temperature, such as activation of the dopants or fabrication of the gate insulator.

The choice of the stacking order of the transistors of the two levels is not random, but takes account of the maximum temperatures associated with the materials, in particular with the semi-conducting materials. The thermal budget of formation of a MOS transistor in germanium is lower than about 600° C., while the thermal budget of formation of a MOS transistor in silicon is higher, generally higher than 800° C. (typically about 800° C. to 1000° C.)

The transistors 13 of the bottom level 11, which are of the n-MOS type, are preferably formed in a layer of silicon with a (100) orientation, whereas the transistors 15 of the top level 12, which are of the p-MOS type, are preferably formed in a layer of germanium with a (110) orientation.

At least one of the first and second semi-conducting layers can be strained in a manner suitable for fabrication of the corresponding transistors. Thus, the silicon layer is preferably strained in tension and the germanium layer in compression. The second semi-conducting layer is preferably made from biaxially strained germanium. The germanium is preferably monocrystalline.

The silicon layer of the bottom level 11, with a (100) orientation, has a very good mobility for electrons, whereas the germanium layer of the top level 12, with a (110) orientation, offers an excellent mobility for holes. The semi-conducting materials used are therefore optimum for the two types of transistors.

The silicon layer of the bottom level 11, which may be strained, can be produced by any suitable known method.

In a first alternative embodiment, this layer is formed on the silicon substrate 10, with a (100) orientation, by heteroepitaxy of a layer of relaxed SiGe, with a germanium composition that increases gradually until the required composition is obtained. Then a thin layer of silicon, with a thickness that is less than the critical (non relaxed) thickness, is formed by heteroepitaxy on the SiGe layer. The required composition of the SiGe layer typically comprises about 20 to 30% of germanium in the silicon, which enables a large increase of the mobility to be achieved in the subsequently produced strained silicon layer.

In a second alternative embodiment, the strained silicon layer is produced by transfer by the Smart Cut® method (hydrogen implantation, bonding and detachment) from a surface layer containing the strained silicon layer and all or part of the SiGe layer on a SOI type structure comprising a silicon substrate and an insulating layer. The SiGe layer is then eliminated by selective chemical etching to leave only the strained silicon layer.

In both the alternative embodiments, the n-MOS transistors 13 are then produced, in conventional manner, in the silicon layer with a (100) orientation. This production comprises the following successive steps: lateral insulation between transistors by etching and deposition of dielectrics, deposition of at least one gate dielectric, deposition and definition of patterns in a conducting material constituting the gate electrode G13, definition of spacers by dielectric deposition and dry etching, doping by ion implantation, activation of the n dopants of the source and drain by annealing and formation of the silicides, for example in NiSi. The dielectric 14 of the bottom level 11 is then deposited on the substrate 10 and the transistors 13. It is then planarized, thus completing fabrication of the bottom level 11.

Figure 9:
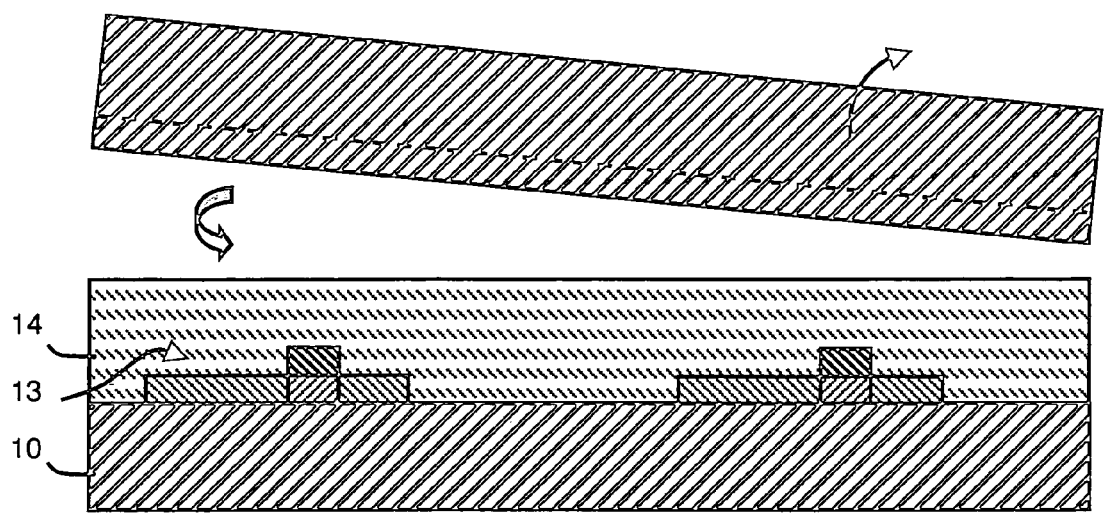
FIG. 9 illustrates a particular embodiment of a circuit according to the invention.

In a preferred embodiment, a germanium layer with a (110) orientation, originating from a substrate containing this material, is then transferred onto the bottom level 11, by molecular bonding and thinning or by the Smart Cut® method (hydrogen implantation, bonding and detachment), as illustrated in FIG. 9. This type of substrate can be a monocrystalline germanium substrate, with a (110) orientation, produced by conventional methods (for example Czochralski) or a silicon substrate with a (110) orientation on which a first relaxed (unstrained) layer of SiGe alloy, called buffer layer, has been grown, with a gradually increasing germanium concentration, followed by growth of a pure germanium layer. The germanium layer can also be obtained from a GeOI substrate which is bonded and the silicon support layer and the insulating (initially buried oxide) layer whereof are eliminated. This germanium layer can also be obtained by Liquid Phase Epitaxy (LPE), for example after opening a cavity opening out onto the substrate, which in this case has a (110) orientation, in order to obtain an oriented crystallization seed, followed by a seed cutting step.

The p-MOS transistors 15 are then produced, in conventional manner, in the germanium layer thus transferred to the bottom level 11. This production successively comprises, as previously, lateral insulation between transistors by etching and deposition of dielectrics, deposition of at least one gate dielectric, deposition and definition of patterns in a conducting material constituting the gate electrode G15, definition of spacers by dielectric deposition and dry etching, doping by ion implantation activation of the p dopants of the source and drain by annealing and formation of the silicides. The use of a, preferably monocrystalline, germanium semi-conducting layer enables the transistors 15 to be fabricated at temperatures as low as 400-600° C. not affecting the transistors 13 already produced at the bottom level 11. These temperatures are in particular compatible with the stability of the suicides of the bottom level transistors, since the suicides presently used (NiSi) are stable until about 600° C., upon addition of some percents of Pt or Pd.

As represented in FIG. 8, the dielectric 16 of the top level 12 is then deposited on the dielectric 14 of the bottom level 11 and on the transistors 15, and is then planarized if required, thus completing fabrication of the top level 12.

Production of a first level of circuit connections and interconnections then begins by etching and metallization of vias through the different layers of the circuit. Single vias V3 and V4, respectively associated with the transistors 13 and 15, are etched through the dielectrics 14 and/or 16 covering the transistors 13 and 15, with stopping on the semi-conducting layer of the corresponding transistor. Multiple vias V1 and V2 interconnect an n-MOS transistor 13 of the bottom level to an associated p-MOS transistor 15 of the top level to form a CMOS circuit.

Figure 10:
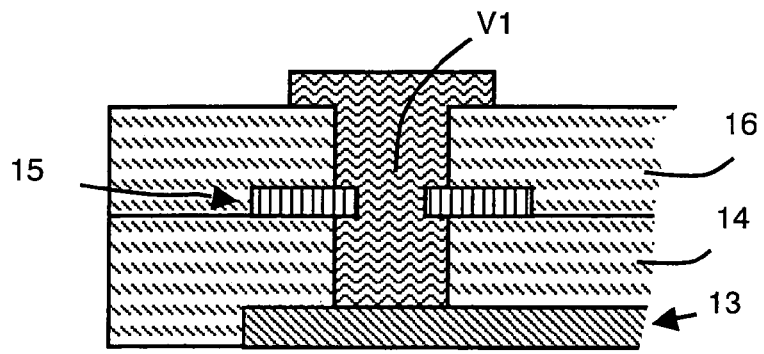
FIG. 10 schematically illustrates a particular embodiment of a multiple via of a circuit according to the invention.

The vias are achieved by dry etching, preferably sequentially with several lithography levels, so as to control the risks of overetching liable to occur if the operation is performed in a single step. The etching profile of the multiple vias V1 and V2, which start respectively from the drain or the source and from the gate of the transistor 13 and pass successively though the dielectric 14, respectively the source or drain and the gate of the associated transistor 15 and the dielectric 16, is preferably adapted so as to maximize the etching surface between the metal of the via and the transistor material. This can for example be achieved by slight overetching of the dielectrics 14 and 16 with respect to the materials of the transistor 15 through which the via passes, as represented in FIG. 10 for the via V1. The hole of the via V1 is thus wider at the level of the dielectrics 14 and 16 than at the level of the semi-conducting layer of the transistor 15 through which it passes.

As represented in FIG. 10, a second interconnect level is formed on the dielectric 16, for example to connect the vias V1 to V4 respectively to the output terminal O, the input terminal I and the supply terminal of the inverter or to other elements (not represented) of the circuit.

The producing method according to the invention thus successively comprises at least:
    fabrication of a first block comprising the n-MOS transistors (13) formed in a semi-conducting layer of silicon having a suitable orientation for fabrication of n-MOS transistors (13),
    transfer to the first block of a semi-conducting layer of germanium having a suitable orientation for fabrication of p-MOS transistors (15) and
    fabrication of the p-MOS transistors (15) in the germanium semi-conducting layer at a temperature not affecting the transistors formed in the silicon semi-conducting layer.

In the particular embodiment described above, the producing method successively comprises:
    fabrication of the n-MOS transistors 13 of the first level or bottom level 11 in a tension strained silicon layer having a (100) orientation,
    deposition and planarization of a dielectric layer 14, at the first level,
    formation of the second semi-conducting layer, made of compression strained monocrystalline germanium with a (110) orientation,
    fabrication of the p-MOS transistors 15 of the second level or top level 12,
    deposition of a second dielectric layer 16, at the second level,
    formation of multiple vertical vias (V1, V2) constituting the interconnections between the transistors (13, 15) of different levels, and of single vertical vias (V3, V4) constituting various connections of the circuit.

Figure 1:
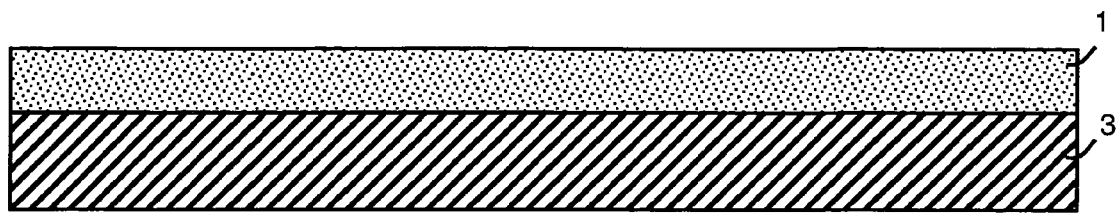
FIGS. 1 to 3 illustrate production of a hybrid substrate according to the prior art by heteroepitaxy.
Figure 2:
Figure 3:
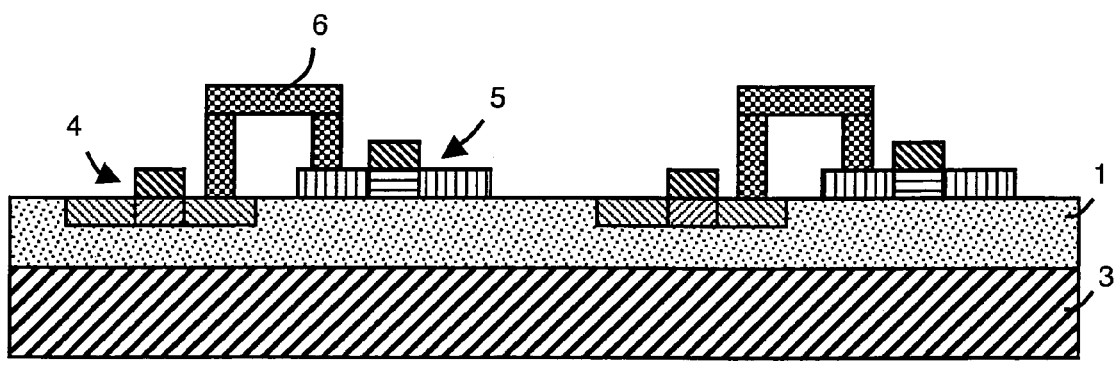
Figure 4:
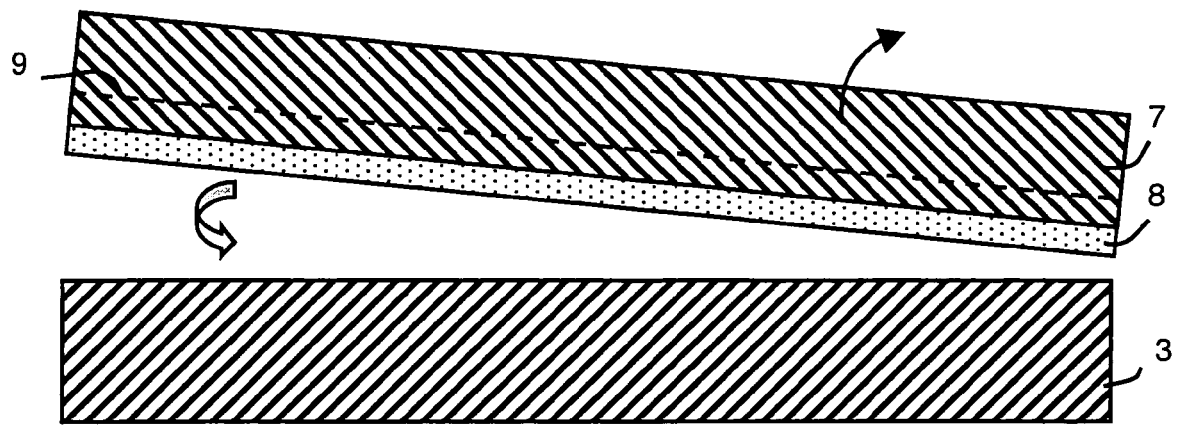
FIG. 4 illustrates formation of a hybrid substrate according to the prior art by layer transfer.
Figure 5:
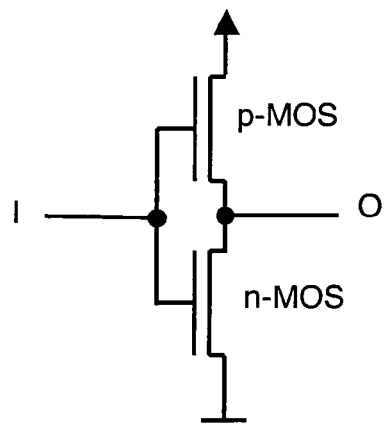
FIG. 5 represents the conventional wiring diagram of an inverter formed by p-MOS and n-MOS transistors.

The transistors 13 and 15 of the bottom and top levels are preferably arranged such that the zones of these transistors designed to be interconnected overlap. Thus for example, in FIGS. 6 to 8, to fabricate an inverter according to FIG. 5, the respective longitudinal axes A13 and A15 of a transistor 13 of the bottom level and of a transistor 15 of the top level, passing respectively via the drain, the channel and the source of the transistor involved, are perpendicular.

In some cases, in particular to overcome connection problems, the transistors are asymmetric, the drain or the source designed to be connected to the source or drain of the associated transistor of the adjacent level being extended longitudinally so as to form a first overlapping zone in which a first interconnection of the transistors of different levels is formed, constituting the output O of the inverter. This first interconnection can then be constituted by a first vertical via V1. At the same time, the gates G13 and G15 of the transistors, conventionally formed above the corresponding channel, are extended perpendicularly to their respective longitudinal axes so as to form a second overlapping zone at one of the ends thereof. A second interconnection of the transistors of different levels, constituting the input I of the inverter, can then be constituted by a second vertical via V2. These interconnections or multiple vias thus connect a transistor directly with the associated complementary transistor of the adjacent level.

Third and fourth vertical vias V3 and V4 are respectively formed at the ends of the transistors 13 and 15 opposite the first overlapping zone. These connections or single vias can then act as connections of the circuit, in particular to the supply terminals of the inverter.

All the interconnections of the CMOS circuit are thus made by means of vertical vias, directly interconnecting the parts to be connected of two associated transistors of different levels and enabling same to be connected to other elements of the circuit. They can be formed at the same time as the single connections connecting a transistor to other elements of the circuit than the complementary transistor of adjacent level.

This particular arrangement of the associated complementary transistors of the two superposed levels enables a very dense 3D assembly to be obtained, with a densification of the number of transistors per surface unit and a reduction of the mean length of the connections.

The temperatures used when fabricating the germanium semi-conducting layer being less than 700° C., the vias can be achieved before the germanium layer is produced, which is notably easier to implement than after bonding of the Ge.

The gate electrode material of each type of transistor (n and p) has to be suited to the work function of the corresponding transistor. In the case of a planar technology, a first material is typically deposited to form first gates associated with one of the two types of transistors, then the material has to be etched to be able to form the second gates associated with the other type of transistor. This additional etching step is not necessary in the case of the three-dimensional technology according to the invention.

The invention claimed is:

1. A three-dimensional integrated CMOS circuit formed in a hybrid substrate with superposed bottom and top levels, comprising:
   a plurality of n-MOS transistors formed, at the bottom level, in a silicon semi-conducting layer having a (100) orientation, and
   a plurality of p-MOS transistors formed, at the top level, in a germanium semi-conducting layer having a (110) orientation,
   wherein an axis passing through a drain and a source of the n-MOS transistor of the plurality of n-MOS transistors is perpendicular to an associated axis passing through a drain and a source of an associated p-MOS transistor of the plurality of p-MOS transistors so as to form at least one overlapping zone in which an interconnection of the n-MOS transistor and the associated p-MOS transistor is formed, and
   wherein the at least one overlapping zone is an overlap between the silicon semi-conducting layer and the germanium semi-conducting layer.

2. The three-dimensional integrated CMOS circuit according to claim 1, wherein at least one of the silicon semi-conducting layer and the germanium semi-conducting layer is strained in a suitable manner for fabrication of the corresponding transistors.

3. The three-dimensional integrated CMOS circuit according to claim 2, wherein the silicon semi-conducting layer is made of tension strained silicon.

4. The three-dimensional integrated CMOS circuit according to claim 2, wherein the germanium semi-conducting layer is made of compression strained germanium.

5. The three-dimensional integrated CMOS circuit according to claim 4, wherein the germanium semi-conducting layer is made of biaxially strained germanium.

6. The three-dimensional integrated CMOS circuit according to claim 1, wherein the germanium is monocrystalline.

7. The three-dimensional integrated CMOS circuit according to claim 1, wherein the drain or the source of the n-MOS transistor of the plurality of n-MOS transistors is designed to be connected to the source or the drain of the associated p-MOS transistor, and wherein at least one of the drain or the source of the n-MOS transistor and the drain or the source of the associated p-MOS transistor is longitudinally extended so as to form a first overlapping zone in which a first interconnection of the n-MOS transistor and the associated p-MOS transistor is formed.

8. The three-dimensional integrated CMOS circuit according to claim 7, comprising vertical connections formed at ends of the n-MOS transistor and the associated p-MOS transistor opposite the first overlapping zone.

9. The three-dimensional integrated CMOS circuit according to claim 1, wherein the n-MOS transistor and the associated p-MOS transistor each have gates extended perpendicularly to their respective axis and associated axis so as to form, at one end thereof, a second overlapping zone in which a second interconnection of the n-MOS transistor and the associated p-MOS transistor is formed.

10. The three-dimensional integrated CMOS circuit according to claim 1, wherein the interconnection passes through an electrode of the associated p-MOS transistor.

11. A method for producing a three-dimensional CMOS integrated circuit in a hybrid substrate with superposed bottom and top levels, the method comprising:
   forming a plurality of n-MOS transistors, at the bottom level, in a silicon semi-conducting layer having a (100) orientation,
   transferring a germanium semi-conducting layer having a (110) orientation onto the silicon semi-conducting layer, and
   forming a plurality of p-MOS transistors, at the top level, in the germanium semi-conducting layer, the plurality of the p-MOS transistors being formed at a temperature not affecting the plurality of the n-MOS transistors formed in the silicon semi-conducting layer,
   wherein an axis passing through a drain and a source of the n-MOS transistor of the plurality of n-MOS transistors is perpendicular to an associated axis passing through a drain and a source of an associated p-MOS transistor of the plurality of p-MOS transistors so as to form at least one overlapping zone in which an interconnection of the n-MOS transistor and the associated p-MOS transistor is formed, and
   wherein the at least one overlapping zone is an overlap between the silicon semi-conducting layer and the germanium semi-conducting layer.

12. Method according to claim 11, wherein the plurality of the p-MOS transistors are formed in the germanium semi-conducting layer at a temperature of about 400 to about 600° C.

13. Method according to claim 11, wherein the transfer of the germanium semi-conducting layer is performed by molecular bonding and thinning.

14. Method according to claim 11, wherein the transfer of the germanium semi-conducting layer is performed by hydrogen implantation, bonding and detachment.

15. Method according to claim 11, wherein the transfer of the germanium semi-conducting layer is performed by liquid phase epitaxy after a cavity has been opened out onto the hybrid substrate, wherein the hybrid substrate has a (110) orientation, in order to obtain an oriented crystallization seed.

16. Method according to claim 11, further comprising forming vertical multiple vias constituting the interconnection between the n-MOS transistor and the associated p-MOS transistor.

17. Method according to claim 11, further comprising forming vertical single vias constituting the interconnection between the n-MOS transistor and the associated p-MOS transistor.

18. Method according to claim 11, further comprising forming vias before the germanium semi-conducting layer is transferred.

* * * * *